(12) United States Patent
Pentakota et al.

(10) Patent No.: US 10,903,845 B2
(45) Date of Patent: Jan. 26, 2021

(54) DELAY-BASED RESIDUE STAGE

(71) Applicant: TEXAS INSTRUMENTS INCORPORATED, Dallas, TX (US)

(72) Inventors: Visvesvaraya Appala Pentakota, Bengaluru (IN); Rishi Soundararajan, Bengaluru (IN); Shagun Dusad, Bengaluru (IN); Chirag Chandrahas Shetty, Thane (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/941,718

(22) Filed: Jul. 29, 2020

(65) Prior Publication Data

US 2020/0358450 A1    Nov. 12, 2020

Related U.S. Application Data

(63) Continuation of application No. 16/860,145, filed on Apr. 28, 2020, now Pat. No. 10,778,243, which is a
(Continued)

(51) Int. Cl.
*H03M 1/38* (2006.01)
*H03K 5/24* (2006.01)
(Continued)

(52) U.S. Cl.
CPC ........... *H03M 1/38* (2013.01); *H03K 5/2481* (2013.01); *H03K 19/20* (2013.01); *H03M 1/00* (2013.01); *H03M 1/12* (2013.01); *H03M 1/14* (2013.01)

(58) Field of Classification Search
CPC ............. H03M 1/12; H03M 1/00; H03M 1/14
(Continued)

(56) References Cited

U.S. PATENT DOCUMENTS 5,495,247 A  2/1996 Yamamoto et al.
7,557,746 B1  7/2009 Waltari
(Continued)

OTHER PUBLICATIONS

U.S. Appl. No. 16/410,698, Notice of Allowance, dated Feb. 10, 2020, p. 6.

*Primary Examiner* — Joseph J Lauture
(74) *Attorney, Agent, or Firm* — Mark Allen Valetti; Charles A. Brill; Frank D. Cimino

(57) ABSTRACT

A clock-less delay comparator coupled to a first input signal and a second input signal, the clock-less delay comparator comprising: a first transistor having a control terminal coupled to the second input signal, a first current terminal coupled to a first voltage supply, and a second current terminal; a second transistor having a control terminal, a first current terminal coupled to the first voltage supply, and a second current terminal; a third transistor having a control terminal, a first current terminal coupled to the first voltage supply, and a second current terminal; a fourth transistor having a control terminal coupled to the first input signal, a first current terminal coupled to the first voltage supply, and a second current terminal; a fifth transistor having a control terminal coupled to the second input signal, a first current terminal, and a second current terminal coupled to the control terminal of the third transistor; a sixth transistor having a control terminal coupled to the first input signal, a first current terminal, and a second current terminal coupled to the control terminal of the second transistor and the second current terminal of the third transistor; a seventh transistor having a control terminal coupled to the control terminal of the second transistor, a first current terminal coupled to a second voltage supply, and a second current terminal coupled to the first current terminal of the fifth transistor; an eighth transistor having a control terminal coupled to the control terminal of the third transistor, a first
(Continued)

current terminal coupled to the second voltage supply, and a second current terminal coupled to the first current terminal of the sixth transistor; a ninth transistor having a control terminal coupled to the first input signal, a first current terminal coupled to the second current terminal of the first transistor, and a second current terminal coupled to the second current terminal of the second transistor and the second current terminal of the fifth transistor; and a tenth transistor having a control terminal coupled to the second input signal, a first current terminal coupled to the second terminal of the fourth transistor, and a second current terminal coupled to the second current terminal of the third transistor.

18 Claims, 7 Drawing Sheets

Related U.S. Application Data continuation of application No. 16/517,796, filed on Jul. 22, 2019, now Pat. No. 10,673,453.

(60) Provisional application No. 62/786,594, filed on Dec. 31, 2018.

(51) Int. Cl.
    *H03M 1/14* (2006.01)
    *H03M 1/12* (2006.01)
    *H03M 1/00* (2006.01)
    *H03K 19/20* (2006.01)

(58) Field of Classification Search
    USPC .................. 341/161, 162, 155, 157, 126
    See application file for complete search history.

(56) References Cited

U.S. PATENT DOCUMENTS

| | | | |
|---|---|---|---|
| 7,737,875 | B2 | 6/2010 | Waltari et al. |
| 8,183,903 | B2 | 5/2012 | Glass et al. |
| 9,089,388 | B2 | 1/2015 | Zegarelli |
| 10,003,353 | B2 * | 6/2018 | Kris .................. H03M 1/502 |
| 2012/0105264 | A1 | 5/2012 | Ryu et al. |
| 2014/0361917 | A1 | 12/2014 | Matsuno et al. |

* cited by examiner

DELAY-BASED RESIDUE STAGE

CROSS-REFERENCE TO RELATED APPLICATIONS

This application claims priority to U.S. Provisional Patent Application No. 62/786,594, filed on Dec. 31, 2018 and to U.S. patent application Ser. No. 16/517,796, filed Jul. 22, 2019 and to U.S. patent application Ser. No. 16/860,145, filed Apr. 28, 2020. The entire disclosure of 62/786,594 and Ser. Nos. 16/517,796 and 16/860,145 are hereby fully incorporated herein by reference.

BACKGROUND

An analog-to-digital (A/D) converter (ADC) system may be used to generate digital codes which represent the level of an analog signal. It is desirable to operate an analog-to-digital converter at high speed, with low power, with substantially no meta-stability, and without requiring a large amount of area.

SUMMARY

This disclosure relates to an analog-to-digital converter which has a logic gate for generating an output signal having a delay corresponding to a delay between first and second input signals. The logic gate includes first and second inputs for receiving the first and second input signals, and an output for outputting the output signal. A delay comparator receives the first and second input signals and generates a digital signal based on which one of the first and second signals is first received by the delay comparator, such that the digital signal is representative of the order of the first and second input signals. The delay comparator also generates a delay signal having a delay corresponding to the delay between the first and second input signals. The delay comparator has first and second inputs for receiving the first and second input signals, a digital output for outputting the digital signal, and a delay output for outputting the delay signal.

This disclosure also relates to an analog-to-digital converter which has a front stage and one or more residual stages. The front stage has delay comparators for processing incoming signals having a delay, for outputting digital signals based on which ones of the incoming signals are first received by the delay comparators, such that the digital signals are representative of the order of the incoming signals, and for generating delay signals based on the delay of the incoming signals, and a combiner for combining the delay signals into first and second input signals.

This disclosure also relates to a delay comparator which may be, if desired, operated in an asynchronous manner without a clock. The delay comparator has a comparator circuit having transistors coupled to conductive lines, the transistors being configured to respond to input signals such that the comparator circuit generates signals on the conductive lines representative of an order of, and a delay between, the input signals. The delay comparator also has a sign-out circuit having transistors coupled to the conductive lines, for receiving the signals on the conductive lines, and for generating a sign signal based on which one of the signals on the first and second lines is first received by the sign-out circuit, such that the sign signal is representative of the order of the input signals, and a delay-out circuit having transistors coupled to the conductive lines, for receiving the signals on the conductive lines, and for generating a delay signal representative of the delay between the input signals.

DETAILED DESCRIPTION

Figure 1:
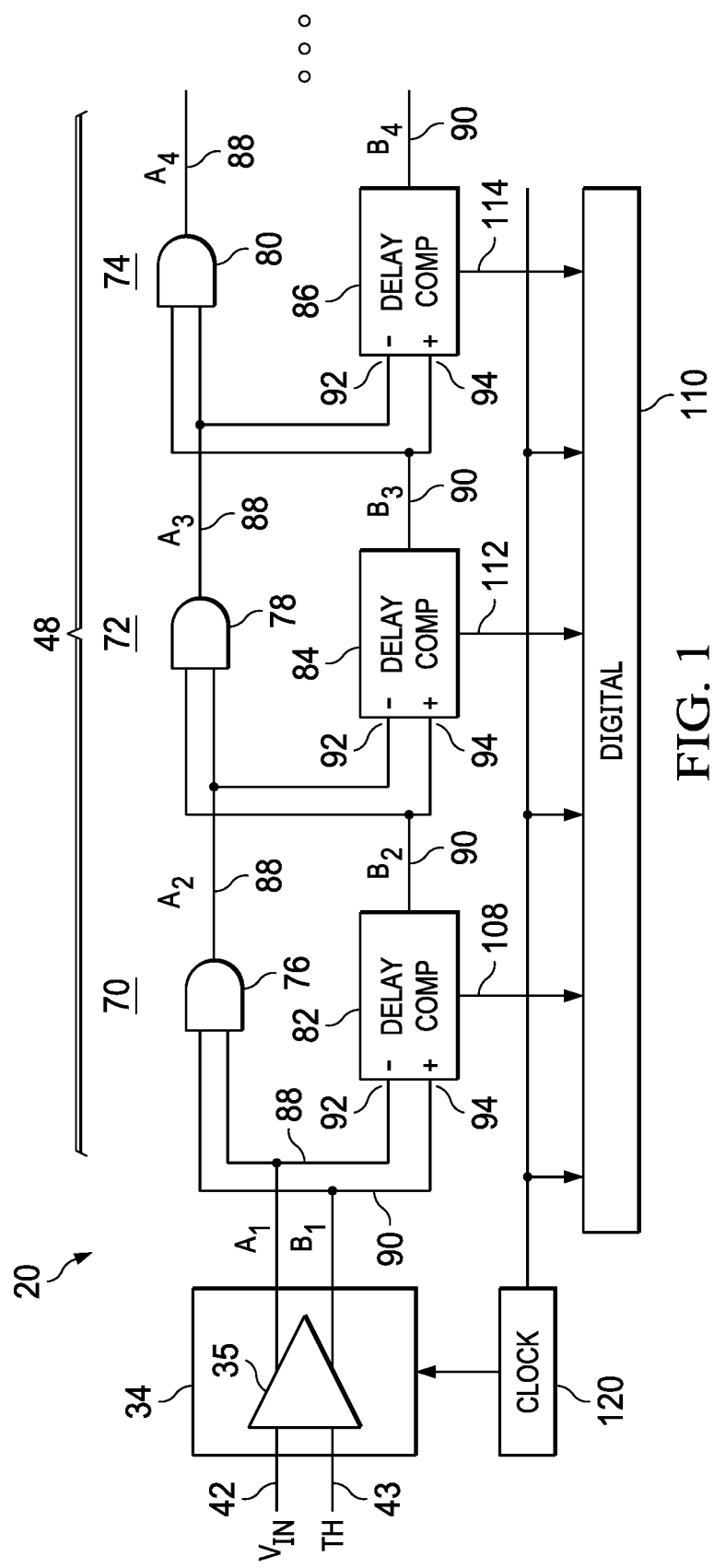
FIG. 1 is a block diagram of an example of an analog-to-digital converter system constructed in accordance with this disclosure.

Referring now to the drawings, where like reference numerals designate like elements, there is shown in FIG. 1 a delay-based analog-to-digital converter system 20 which includes a frontend voltage-to-delay circuit 34 and a backend analog-to-digital converter 48. In the illustrated configuration, the analog-to-digital converter 48 has three or more stages 70, 72, 74, with respective AND gates 76, 78, 80 and delay comparators 82, 84, 86. Please note that the illustrated AND gates are merely examples of logic gates that may be employed according to this disclosure. If desired, this disclosure may be implemented with or without AND gates and/or with or without gates other than AND gates.

Referring again to FIG. 1, in the illustrated configuration, the second and third AND gates 78, 80 are essentially identical to the first AND gate 76, and the second and third delay comparators 84, 86 are essentially identical to the first delay comparator 82. The conductive output lines 88, 90 from the voltage-to-delay circuit 34 are both coupled to inputs of the first AND gate 76. A first one of the conductive lines 88 is also coupled to a first input 92 of the first delay comparator 82, and the second one of the conductive lines 90 is coupled to a threshold input 94 of the first delay comparator 82.

An output line 88 from the first AND gate 76 is electrically coupled to one of the inputs of the second AND gate 78, and to the first input 92 of the second delay comparator 84. A conductive line 90 from the first delay comparator 82 is electrically coupled to the other one of the inputs of the second AND gate 78, and to the threshold input 94 of the second delay comparator 84. In like manner, an output line 88 from the second AND gate 78 is electrically coupled to one of the inputs of the third AND gate 80, and to the first input 92 of the third delay comparator 86, and a conductive line 90 from the second delay comparator 84 is electrically coupled to the other one of the inputs of the third AND gate 80, and to the threshold input 94 of the third delay comparator 86.

The pattern created by the second and third stages 72, 74 may be continued, if desired, for a fourth stage or for as many additional stages as desired. Each successive stage has an AND gate and a delay comparator essentially identical to the AND gates 78, 80 and the delay comparators 84, 86 of the second and third stages 72, 74, and electrically coupled to the AND gate and delay comparator of a preceding stage in the same way that the third AND gate 80 and the third delay comparator 86 are electrically coupled to the second AND gate 78 and the second delay comparator 84.

Figure 2:
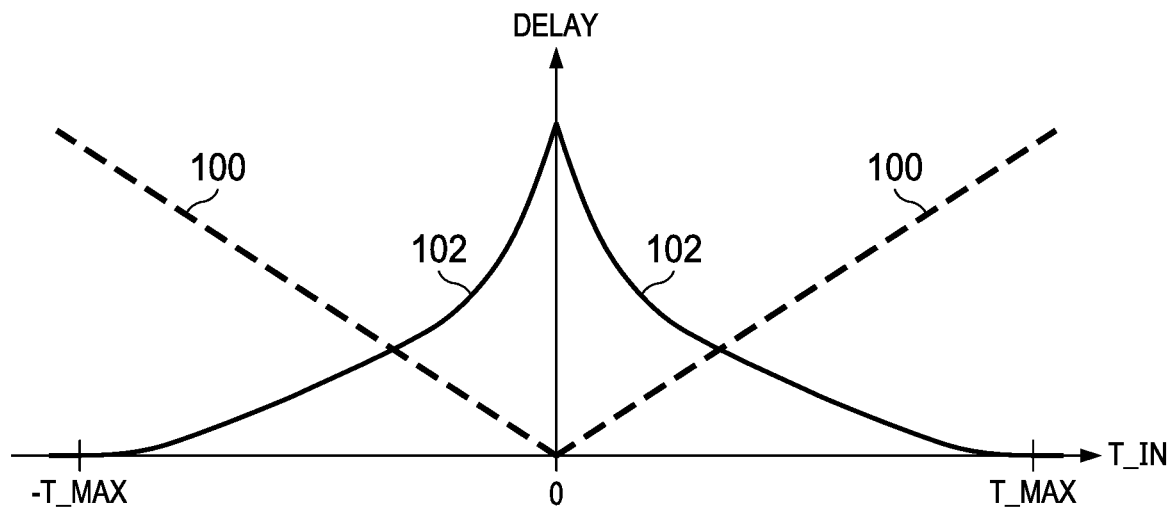
FIG. 2 is a graph which illustrates AND gate-delay and comparator-delay for an analog-to-digital converter of the system shown in FIG. 1, as a function of input signal delay.

In operation, signals $A_N$, $B_N$ (where N=1, 2, 3 . . . for the first, second, third . . . stages 70, 72, 74 . . . respectively) are applied (on lines 88, 90) to respective ones of the AND gates 76, 78, 80, causing the AND gates 76, 78, 80 to generate corresponding signals $A_{N+1}$ (on lines 88). For each one of the AND gates 76, 78, 80, the timing of the leading edge of signal $A_{N+1}$ tracks the timing of the leading edge of the later-arriving of signals $A_N$, $B_N$. In particular, for each one of the AND gates 76, 78, 80, the timing of the leading edge of signal $A_{N+1}$ is equal to the timing of the leading edge of the earlier-arriving of signals $A_N$, $B_N$ plus an amount of time that is related to the extent to which the leading edge of the later-arriving of signals $A_N$, $B_N$ lags behind the leading edge of the earlier-arriving of signals $A_N$, $B_N$. Referring to FIG. 2, the input signal delay T_IN (-T_MAX<T_IN<T_MAX) for a given stage N is the extent to which the signal $A_N$ lags behind signal $B_N$. The delay 100 caused by the respective AND gate (that is, the extent to which the leading edge of the respective signal $A_{N+1}$ lags behind the leading edge of the earlier-arriving of the corresponding signals $A_N$, $B_N$) is linearly related to the absolute value of the input signal delay T_IN.

Meanwhile, signals $A_N$, $B_N$ (FIG. 1) are also applied (on lines 88, 90) to the first inputs 92 and threshold inputs 94, respectively, of the delay comparators 82, 84, 86, causing the delay comparators 82, 84, 86 to generate corresponding signals $B_{N+1}$ (on lines 90). For each one of the delay comparators 82, 84, 86, the timing of the leading edge of signal $B_{N+1}$ tracks the timing of the leading edge of the earlier-arriving of signals $A_N$, $B_N$. In particular, for each one of the delay comparators 82, 84, 86, the timing of the leading edge of signal $B_{N+1}$ is equal to (1) the timing of the leading edge of the earlier-arriving of signals $A_N$, $B_N$ plus (2) a delay 102 (FIG. 2) that is logarithmically inversely related to the absolute value of the input signal delay T_IN.

Figure 3:
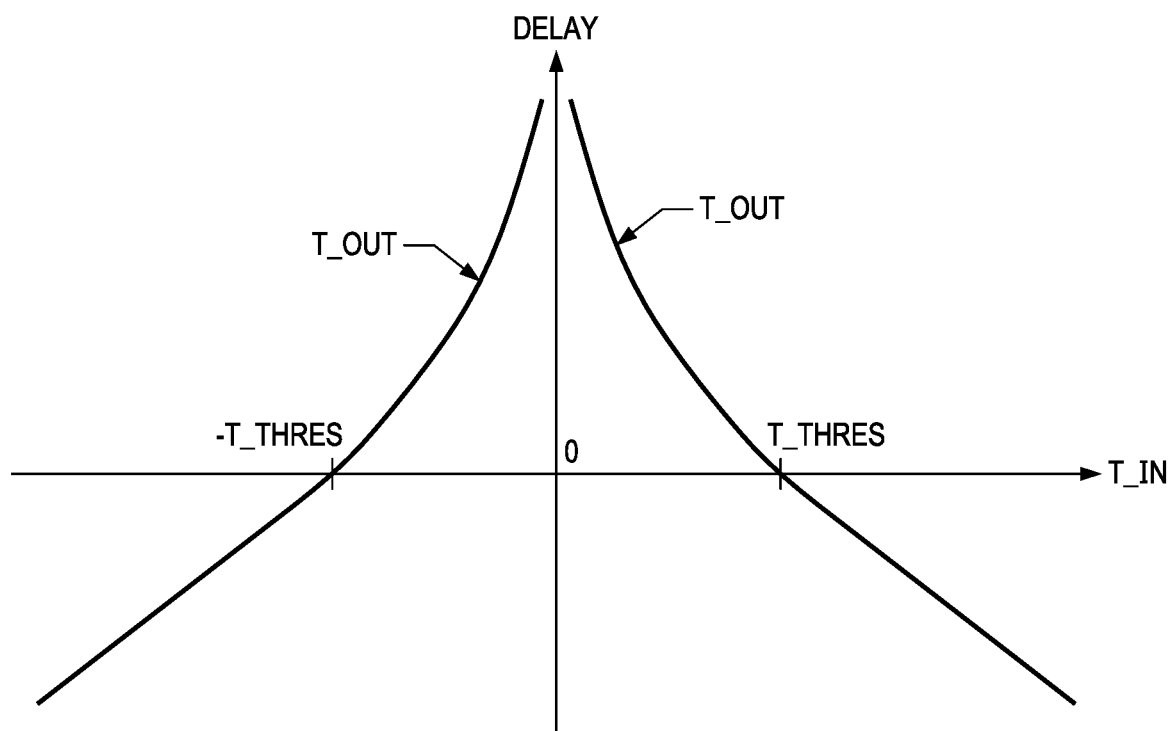
FIG. 3 is a graph which illustrates output signal delay as a function of the input signal delay of FIG. 2.

Subtracting the AND gate-delay 100 from the comparator-delay 102 yields the output signal delay T_OUT (FIG. 3) for any given stage. When the absolute value of the input signal delay T_IN is less than a threshold delay T_THRES, then the output signal delay T_OUT is a positive value (meaning that the leading edge of signal $B_{N+1}$ generated by the respective delay comparator 82, 84, 86 precedes the leading edge of signal $A_{N+1}$ generated by the respective AND gate 76, 78, 80). On the other hand, when the absolute value of the input signal delay T_IN is greater than the threshold delay T_THRES, then the output signal delay T_OUT is a negative value (meaning that the leading edge of signal $B_{N-1}$ lags behind the leading edge of corresponding signal $A_{N+1}$).

In operation, the first delay comparator 82 (FIG. 1) issues a first sign signal ("1" or "0") on a first digital line 108 (an example of a digital output) to a digital block 110. The first sign signal (an example of a digital signal in accordance with this disclosure) is based on which one of the leading edges of the signals $A_1$, $B_1$ is first received by the first delay comparator 82, such that the first sign signal reflects the order of the leading edges of signals $A_1$, $B_1$ applied to the first and threshold inputs 92, 94 of the first delay comparator 82. Then, the first AND gate 76 and the first delay comparator 82 generate signals $A_2$, $B_2$ which are applied to the AND gate 78 and the delay comparator 84 of the second stage 72. The second delay comparator 84 issues a second sign signal ("1" or "0") on a second digital line 112 to the digital block 110. The second sign signal is based on which one of the leading edges of the signals $A_2$, $B_2$ is first received by the second delay comparator 84, such that the second sign signal reflects the order of the leading edges of the signals $A_2$, $B_2$ applied to the inputs 92, 94 of the second delay comparator 84.

Then, the second AND gate 78 and the second delay comparator 84 generate signals $A_3$, $B_3$ which are applied to the AND gate 80 and the delay comparator 86 of the third stage 74. The third delay comparator 86 issues a third sign signal ("1" or "0") on a third digital line 114 to the digital block 110. The third sign signal is based on which one of the leading edges of the signals $A_3$, $B_3$ is first received by the third delay comparator 86, such that the third sign signal reflects the order of the leading edges of the signals $A_3$, $B_3$ applied to the inputs 92, 94 of the third delay comparator 86. The pattern may be continued for a fourth stage or for more than four stages, as desired.

In the illustrated configuration, the order and relative timing of the leading edges of signals $A_1$, $B_1$ generated by the voltage-to-delay converter circuit 34 are representative of an input voltage $V_{IN}$ (on a conductive line 42) sampled by the voltage-to-delay converter circuit 34 at a timing determined by a clock 120. In operation, the voltage-to-delay circuit 34 outputs two edges (the leading edges of the input signals $A_1$, $B_1$) with delay proportional to a delay difference between the input voltage $V_{IN}$ and the clock 120.

By way of example, the voltage-to-delay circuit 34 illustrated in FIG. 1 has a threshold integrating preamplifier 35. At a suitable timing, determined by the clock 120, the input voltage $V_{IN}$, on the line 42, is sampled at a first input of the preamplifier 35. A threshold voltage TH, on a line 43, is applied to a second input of the preamplifier 35. The first and second signals $A_1$, $B_1$ are generated on first and second outputs 88, 90 of the preamplifier 35. The order and delay of the first and second signals $A_1$, $B_1$ represent the magnitude of the input voltage $V_{IN}$ relative to the threshold voltage TH. In the illustrated configuration, by way of example, if the sampled input voltage $V_{IN}$ is greater than a predetermined threshold voltage, then the leading edge of signal $A_1$ (on line 88 going into the first stage 70) lags behind the leading edge of signal $B_1$ (on line 90 going into the first stage 70). If the sampled input voltage $V_{IN}$ is less than the predetermined threshold voltage, then the leading edge of signal $A_1$ precedes the leading edge of signal $B_1$. If the sampled input voltage $V_{IN}$ is relatively close to the threshold voltage, then the absolute value of the input signal delay T_IN going into the first stage 70 will be relatively long. If the sampled input voltage $V_{IN}$ is not relatively close to the threshold voltage, then the absolute value of the input signal delay T_IN going into the first stage 70 will be relatively short.

The delay-based analog-to-digital converter system 20 may be employed with the voltage-to-delay circuit 34 shown in FIG. 1, or with another suitable voltage-to-delay circuit. The illustrated voltage-to-delay circuit 34, with the preamplifier 35, is a non-limiting example of a voltage-to-delay circuit for generating the first and second signals $A_1$, $B_1$. If desired, a preamplifier for a voltage-to-delay circuit may be constructed without an inbuilt threshold. If desired, the preamplifier may have a four-input structure, with a differential input and a differential threshold. Moreover, other suitable devices or structures may be used as a voltage-to-delay circuit to generate the first and second signals $A_1$, $B_1$. A suitable voltage-to-delay circuit for the analog-to-digital converter system 20 may have, for example, multiple threshold voltages and/or multiple logic elements, electrical connections, and other devices.

Figure 4:
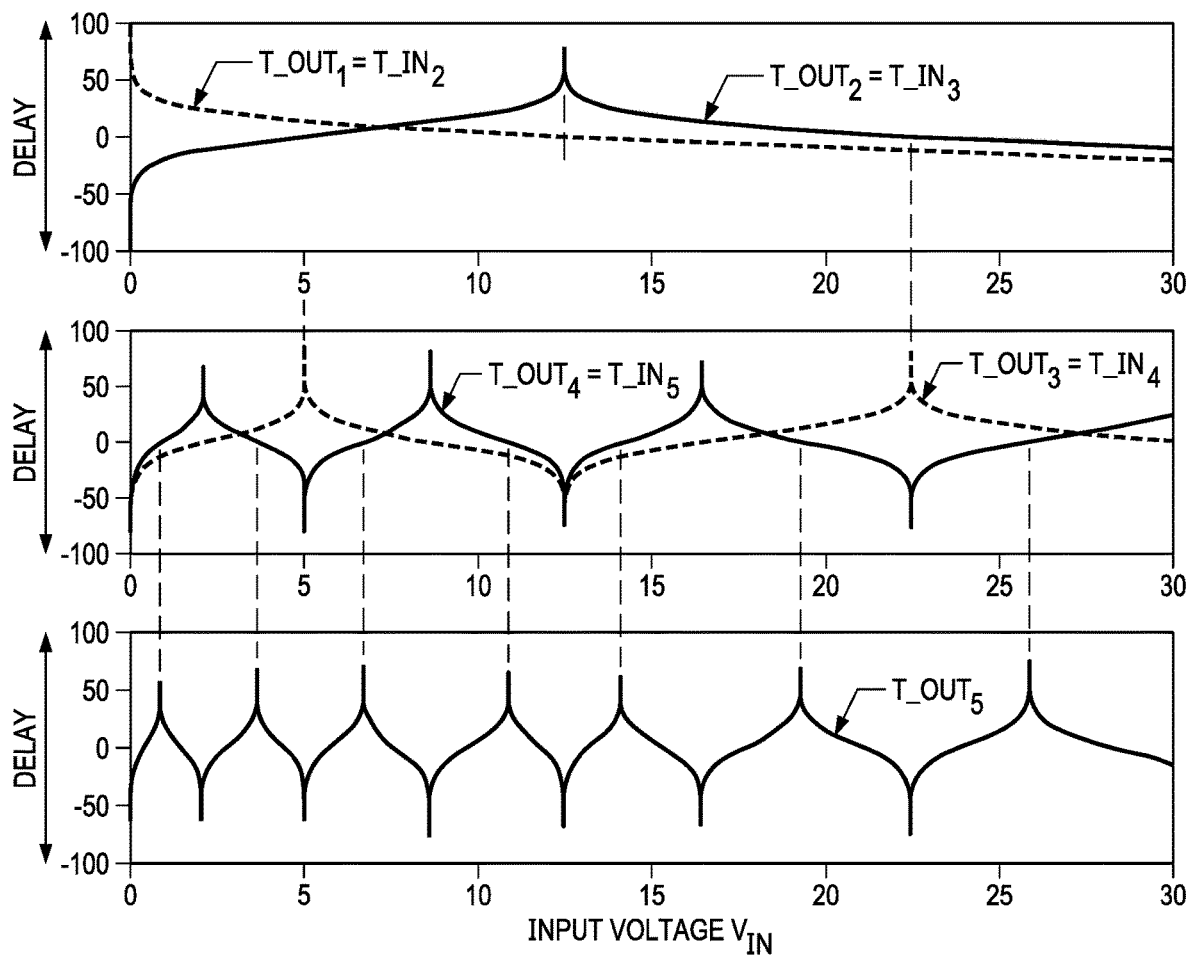
FIG. 4 is a diagram for an example of an analog-to-digital converter, showing output signal delays for successive stages as a function of input voltage.

The output signal delay $T\_OUT_N$ for any given stage N is a function of the input signal delay $T\_IN_N$ for the same stage, and that input signal delay $T\_IN_N$ is the output signal delay $T\_OUT_{N-1}$ for the preceding stage, and the pattern goes back to the input signal delay $T\_IN_1$ for the first stage 70, which is representative of the input voltage $V_{IN}$. Therefore, it is possible to characterize a series of output signal delays $T\_OUT_N$ all as functions of the sampled input voltage $V_{IN}$, as illustrated, by way of example, in FIG. 4. Please note that FIG. 4 is just an example to facilitate clarity of illustration, and is not intended to limit the scope of this disclosure. This disclosure is in no way limited to the specific numerical values or the specific shapes of the output signal delay curves illustrated in FIG. 4.

In the example illustrated in FIG. 4, the predetermined threshold voltage is 0 volts. If the sampled input voltage $V_{IN}$ is, for example, 2 volts, then the leading edge of signal $A_1$ lags behind the leading edge of signal $B_1$. Therefore, in this example, the leading edge of signal $B_1$ arrives at the threshold input 94 (FIG. 1) of the first delay comparator 82 before the leading edge of signal $A_1$ arrives at the first delay comparator 82, such that the first sign signal (on line 108) is "1," meaning that the sampled input voltage $V_{IN}$ is greater than the threshold voltage (that is, in this example, greater than 0 volts).

Then, continuing with the same example, when the sampled input voltage $V_{IN}$ is 2 volts (relatively close to 0 volts), the output signal delay $T\_OUT_1$ of signals $A_2$, $B_2$ is a positive value. As a result, the second sign signal generated by the second delay comparator 84 (on line 112) is "1," meaning, in this example, that the sampled input voltage $V_{IN}$ is less than about 12.5 volts. Continuing with the same example, the output signal delay $T\_OUT_2$ of signals $A_3$, $B_3$ is a negative value. As a result, the third sign signal generated by the third delay comparator 86 (on line 114) is "0," which means in this example that the sampled input voltage $V_{IN}$ is less than about 5 volts. The pattern may be continued for a fourth stage or for more than four stages, to obtain even greater resolution, if desired. FIG. 4 shows $T\_OUT_N$ curves for five successive stages following the first stage 70.

The first and subsequent stages 70, 72, 74 can be used as a residue pipeline stage, and have numerous advantages. Among other things, the analog-to-digital converter 48 can be operated without any decision block in the main signal path. If desired, the converter 48 can be operated without a flash comparator or a digital-to-analog converter in the critical path, and the converter 48 can be operated without requiring interpolation. As a result, the analog-to-digital converter 48 can be operated with a low probability of meta-stability even at high speed. If desired, the analog-to-digital converter 48 may be operated at a very high speed, without consuming large amounts of power, while occupying a small amount of area on or within a chip or other electronic device.

As discussed below in connection with FIGS. 8 and 9, the analog-to-digital converter 48 may be operated without clock propagation across residue stages. In this sense, the analog-to-digital converter 48 includes merged clock-less comparators, and can be operated, if desired, as an asynchronous pipeline device. The converter 48 may be employed, if desired, in a pipelining without clock process. The merged clock-less comparators can provide sign and delay information for each successive stage of the analog-to-digital converter. In preferred embodiments of this disclosure, the successive digital residue stages are all operated in delay domain (all gain is in the delay domain).

Figure 5:
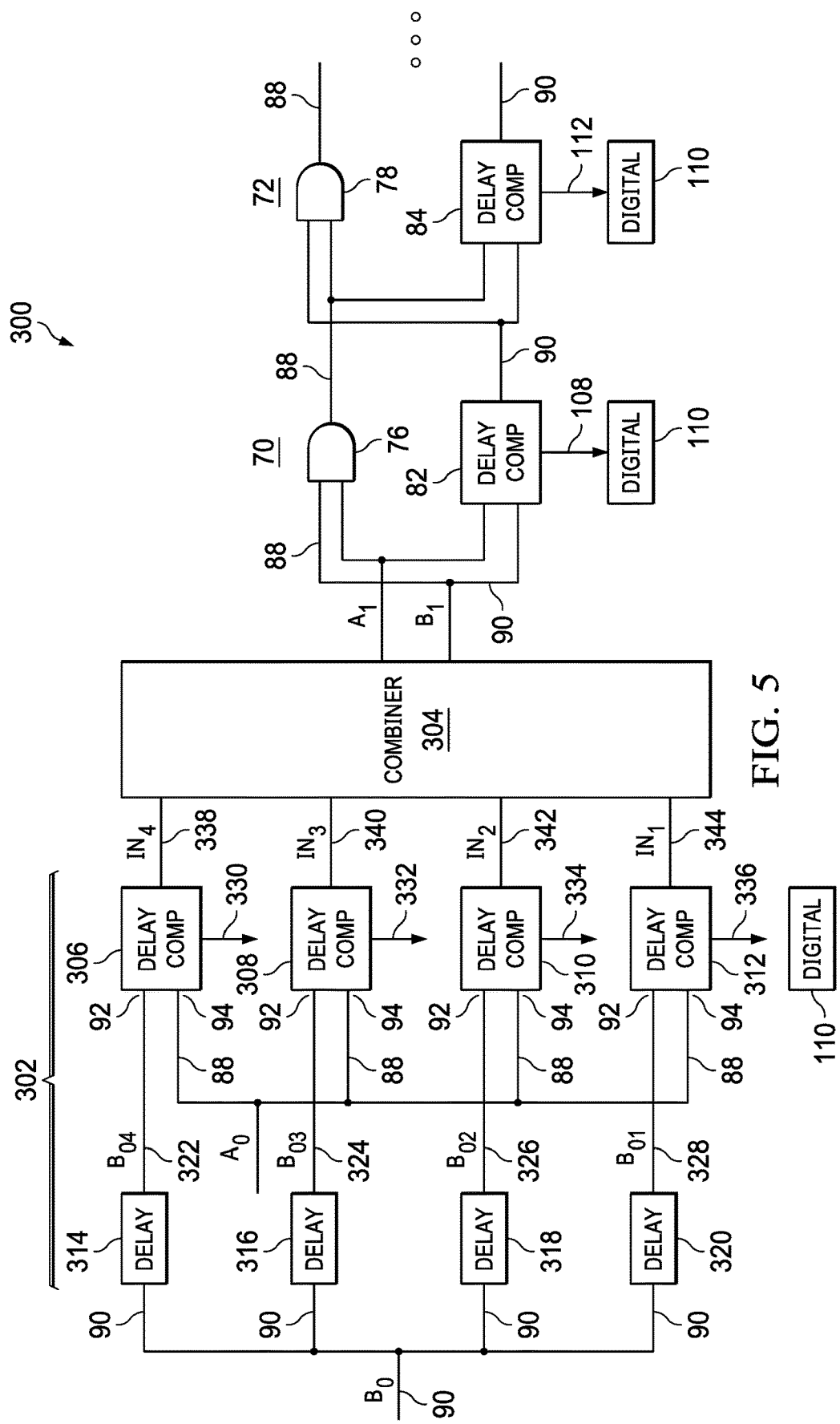
FIG. 5 is a block diagram of another example of an analog-to-digital converter constructed in accordance with this disclosure.

FIG. 5 illustrates another analog-to-digital converter 300, having a zero-level stage 302, a combiner 304, and two or more successive stages 70, 72. The zero-level stage 302 and the combiner 304 together constitute an example of a front stage for purposes of this disclosure. The zero-level stage 302 has four delay comparators 306, 308, 310, 312. This disclosure is not limited, however, to the details of the illustrated example. This disclosure may be implemented, if desired, with a zero-level stage which has fewer or more than four delay comparators. In the configuration shown in FIG. 5, the zero-level stage 302 generates two bits of digital information for the digital block 110. The successive stages 70, 72 operate the same as described above in connection with FIG. 1. Each one of the successive stages 70, 72 generates a single bit of digital information for the digital block 110.

In the FIG. 5 configuration, first and second signals $A_0$, $B_0$ are received from the voltage-to-delay circuit 34 on respective first and second conductive output lines 88, 90. (The voltage-to-delay circuit 34 is not illustrated in FIG. 5.) In the illustrated example, the leading edge of the signal $B_0$ on the second output line 90 precedes the leading edge of the signal $A_0$ on the first output line 88. The first signal $A_0$ is applied to the threshold inputs 94 of the delay comparators 306, 308, 310, 312. In the illustrated configuration, the delay comparators 306, 308, 310, 312 are essentially identical to each other, and are essentially identical to the delay comparators 82, 84, 86 illustrated in FIG. 1. The second signal $B_0$ is applied to four different delay circuits 314, 316, 318, 320 which generate four corresponding signals $B_{04}$, $B_{03}$, $B_{02}$, $B_{01}$ on respective output lines 322, 324, 326, 328. The delayed signals $B_{04}$, $B_{03}$, $B_{02}$, $B_{01}$ are applied to the first inputs 92 of the respective delay comparators 306, 308, 310, 312.

Since the delay circuits 314, 316, 318, 320 are different from each other, the timings of the leading edges of the delayed signals $B_{04}$, $B_{03}$, $B_{02}$, $B_{01}$ are different from each other. Each one of the delay comparators 306, 308, 310, 312 issues a sign signal, on respective digital lines 330, 332, 334, 336, to the digital block 110. The sign signals on lines 330, 332, 334, 336 are functionally related to the difference in timing between the leading edges of the signals $A_0$, $B_0$ received from the voltage-to-delay circuit 34 (not illustrated in FIG. 5), and are therefore functionally related to the input voltage $V_{IN}$ sampled by the voltage-to-delay circuit 34.

The delay comparators 306, 308, 310, 312 generate respective delay signals $IN_4$, $IN_3$, $IN_2$, $IN_1$ on respective output lines 338, 340, 342, 344. The delay signals $IN_4$, $IN_3$, $IN_2$, $IN_1$ are applied to the combiner 304 by the output lines 338, 340, 342, 344. Since the delay circuits 314, 316, 318, 320 are different from each other, the timings of the leading edges of the delay signals $IN_4$, $IN_3$, $IN_2$, $IN_1$ are different from each other.

Figure 6:
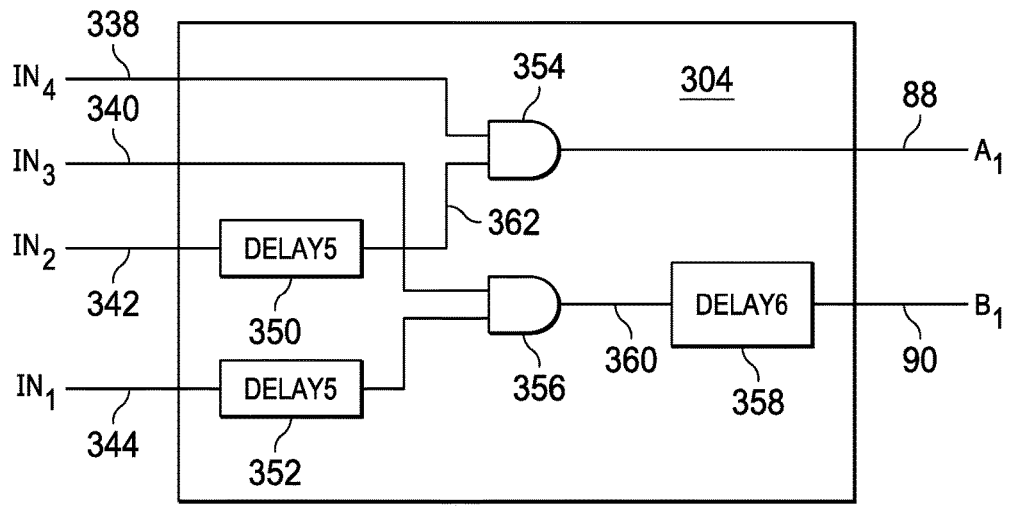
FIG. 6 is a block diagram of a combiner for the analog-to-digital converter of FIG. 5.

As illustrated in FIG. 6, the combiner 304 has two fifth delay circuits 350, 352, two AND gates 354, 356, and a sixth delay circuit 358. In the illustrated configuration, the fifth delay circuits 350, 352 are essentially identical to each other. As noted above, however, this disclosure is not limited to the details of the configurations shown and described herein. Meanwhile, the third and fourth delay signals $IN_2$, $IN_1$ are applied to the fifth delay circuits 350, 352, on conductive lines 342, 344, and the first and second delay signals $IN_4$, $IN_3$ are applied to the AND gates 354, 356, on conductive lines 338, 340. Output signals from the fifth delay circuits 350, 352 are also applied to the AND gates 354, 356, on conductive lines 362, 364. An output signal from one of the AND gates 356 is applied to the sixth delay circuit 358, on a conductive line 360. The other AND gate 354 generates a signal $A_1$ on conductive line 88. The sixth delay circuit 358 generates a signal $B_1$ on conductive line 90.

In operation, the timings of the leading edges of the signals output from the fifth and sixth delay circuits 350, 352, 358, on conductive lines 362, 364, 90, are delayed relative to the respective timings of the leading edges of the signals input to the delay circuits 350, 352, 358. The timings of the leading edges of signals output from the AND gates 354, 356, on lines 88, 360, correspond to the respective timings of the later-arriving of the signals input to the AND gates 354, 356. The relative timing of the leading edges of the signals $A_1$, $B_1$ on lines 88, 90 is functionally related to the input voltage $V_{IN}$. In other words, the delay circuits 350, 352, 358 and the logic gates 354, 356 establish a transfer function between the delay of the incoming signals $IN_4$, $IN_3$, $IN_2$, $IN_1$ and the delay of the first and second input signals $A_1$, $B_1$.

Referring again to FIG. 5, the output signals $A_1$, $B_1$ generated by the combiner 304 are applied to the first stage 70 on the output lines 88, 90. The first residual stage 70 is coupled to the front stage 302, 304, the second residual stage 72 is coupled to the first stage 70, and so on. Thus, the configuration illustrated in FIG. 5 is essentially the same as the configuration illustrated in FIG. 1, except that the configuration illustrated in FIG. 5 has the zero-level stage 302 and the combiner 304 operationally interposed between the voltage-to-delay circuit 34 and the first and subsequent stages 70, 72, 74, and the zero-level stage 302 provides additional information to the digital block 110 on lines 330, 332, 334, 336.

Figure 7:
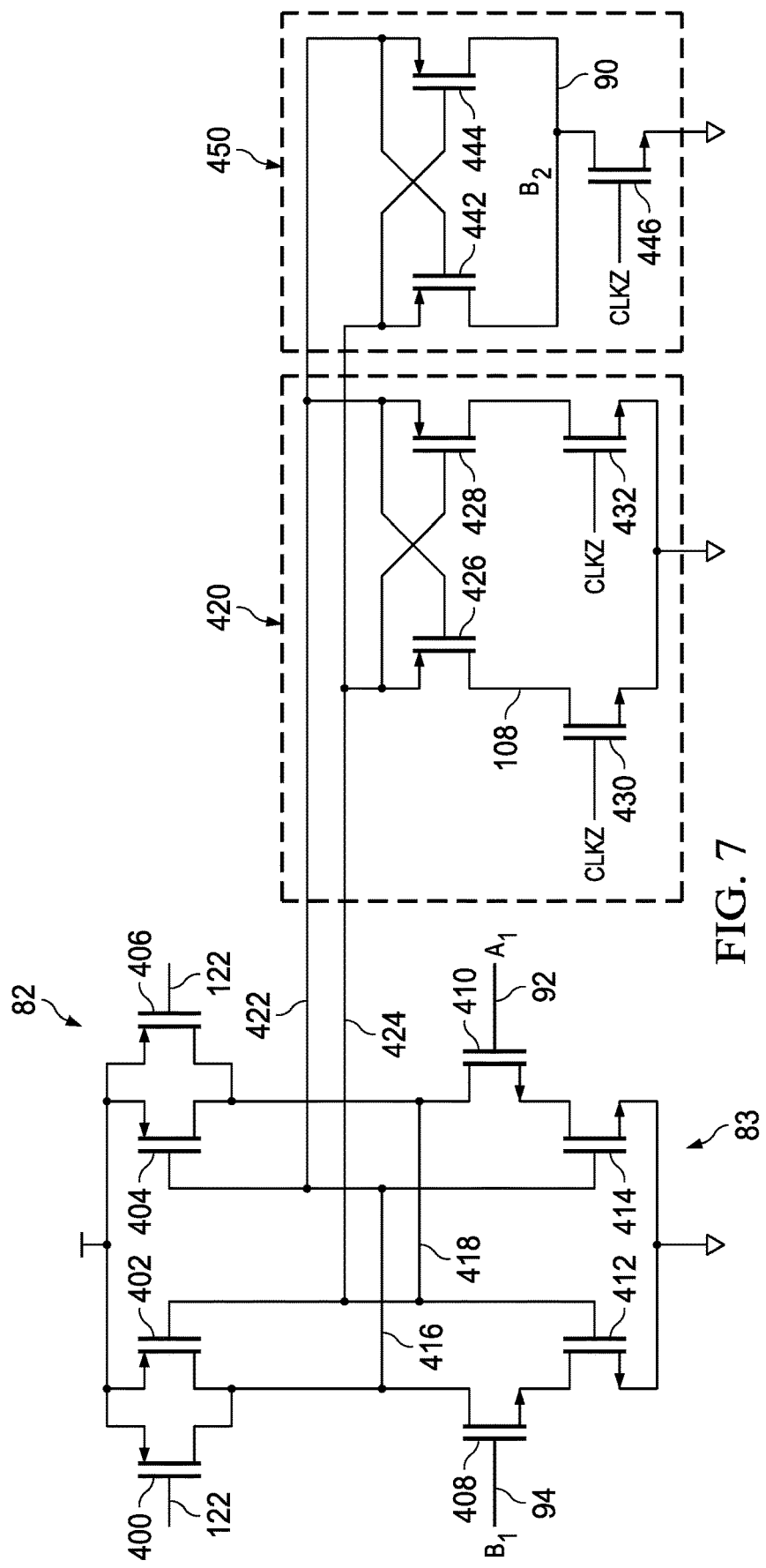
FIG. 7 is a circuit diagram of an example of a comparator circuit merged with sign-out and delay-out circuits.

Referring now to FIG. 7, the delay comparator 82 has a comparator circuit 83 which has first, second, third, fourth, fifth, sixth, seventh, and eighth transistors 400, 402, 404, 406, 408, 410, 412, 414. The timing of the delay comparator 82 is controlled by a signal from the clock 120 (FIG. 1) which is applied to the gates of the first and fourth transistors 400, 406 (FIG. 7), on a conductive line 122. The first and second signals $A_1$, $B_1$ from the voltage-to-delay circuit 34 are applied to the gates of the sixth and fifth transistors 410, 408, respectively. The drains of the first, second, and fifth transistors 400, 402, 408 are electrically connected to each other, and to the gates of the third and eighth transistors 404, 414, via a first conductive line 416. The drains of the third, fourth, and sixth transistors 404, 406, 410 are likewise electrically connected to each other, and to the gates of the second and seventh transistors 402, 412, via a second conductive line 418.

The first and second conductive lines 416, 418 of the comparator circuit 83 are electrically connected to a sign-out circuit 420 via respective third and fourth conductive lines 422, 424. As illustrated in FIG. 7, the sign-out circuit 420 is merged with the comparator circuit 83. The sign-out circuit 420 has first, second, third, and fourth transistors 426, 428, 430, 432. The third conductive line 422 is electrically connected to the gate and the source of the first and second transistors 426, 428 of the sign-out circuit 420, respectively, while the fourth conductive line 424 is electrically connected to the source and the gate of the first and second transistors 426, 428 of the sign-out circuit 420, respectively.

In operation, when the delay comparator 82 is enabled by the clock signal on line 122, a sign signal is generated within the sign-out circuit 420 on line 108. As explained above in connection with FIG. 1, the sign signal is forwarded to the digital block 110 on the line 108, and represents the order in which the output signals $A_1$, $B_1$ arrive at the first and threshold inputs 92, 94 of the delay comparator 82. The operation of the sign-out circuit 420 is controlled by an inverted clock signal CLKZ applied to the gates of the third and fourth transistors 430, 432 of the sign-out circuit 420. The inverted clock signal CLKZ is an inverted version of the clock signal that is applied to the gates of the first and fourth transistors 400, 406 of the comparator circuit 83 on line 122.

The third and fourth conductive lines 422, 444 are also electrically connected to a delay-out circuit 450. As illustrated in FIG. 7, the delay-out circuit 450 is merged with the comparator circuit 83. The delay-out circuit 450 has first, second, and third transistors 442, 444, 446. The third conductive line 422 is electrically connected to the gate and the source of the first and second transistors 442, 444 of the delay-out circuit 450, respectively, while the fourth conductive line 424 is electrically connected to the source and the gate of the first and second transistors 442, 444 of the delay-out circuit 450, respectively.

In operation, a delay signal $B_2$ is generated on line 90, which is electrically connected to the drains of both of the first and second transistors 442, 444 of the delay-out circuit 450. As explained above in connection with FIG. 1, the timing of the leading edge of the delay signal $B_2$ on outgoing line 90 relative to the timing of the earlier-arriving of the leading edges of the signals $A_1$, $B_2$ on inputs 92, 94 is the comparator delay 102 (FIG. 2). The operation of the delay-out circuit 450 is controlled by the same inverted clock signal CLKZ that is applied to the third and fourth transistors 430, 432 of the sign-out circuit 420. The inverted clock signal CLKZ is applied to the gate of the third transistor 446 of the delay-out circuit 450. The drain of the third transistor 446 of the delay-out circuit 450 is electrically connected to the drains of the first and second transistors 442, 444 of the delay-out circuit 450.

Figure 8:
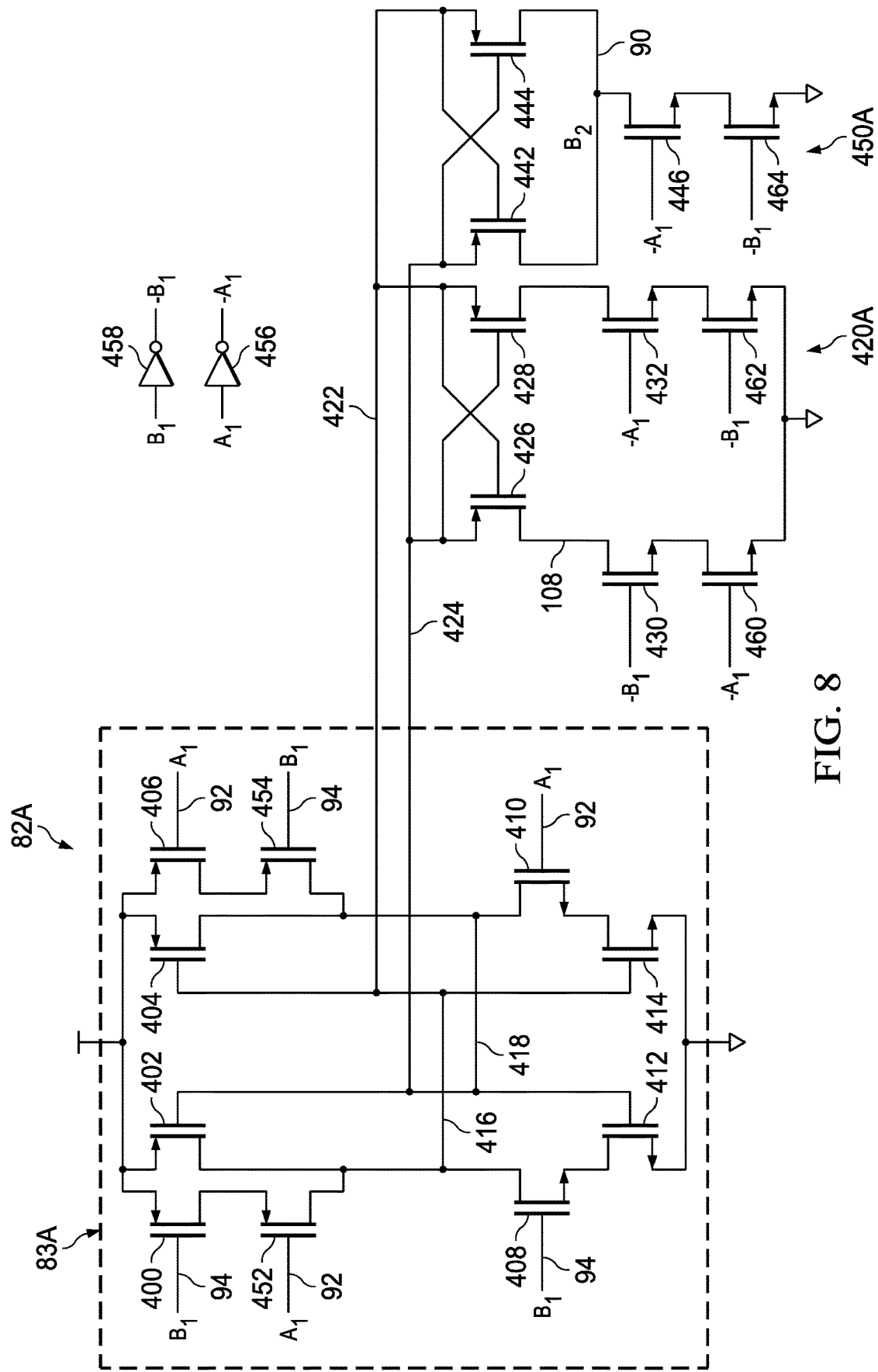
FIG. 8 is a circuit diagram of an example of a clock-less comparator circuit merged with sign-out and delay-out circuits.

A clock-less delay comparator 82A is illustrated in FIG. 8. The clock-less delay comparator 82A is similar to the delay comparator 82 illustrated in FIG. 7 except that (1) the clock-less delay comparator 82A has a comparator circuit 83A which uses the later-arriving of the signals $A_1$, $B_1$, applied to the first and threshold inputs 92, 94, instead of the clock signal, and (2) inverted signals $-A_1$, $-B_1$ are used to control the operation of a sign-out circuit 420A and a delay-out circuit 450A. The clock-less delay comparator 82A may be used in any one of the first and subsequent stages 70, 72, 74 illustrated in FIG. 1, in place of the first and subsequent delay comparators 82, 84, 86.

As illustrated in FIG. 8, the comparator circuit 83A has first and second extra transistors 452, 454. The first input signal $A_1$ is applied, on the first input line 92, to the gates of the fourth and first-extra transistors 406, 452, and the second input signal $B_1$ is applied, on the threshold input line 94, to the first and second-extra transistors 400, 454. The first and first-extra transistors 400, 452 are electrically connected to each other in series, and the fourth and second-extra transistors 406, 454 are electrically connected to each other in series. Thus, the clock-less delay comparator 82A is enabled by the arrival of the later-arriving of the two input signals $A_1$, $B_1$.

At the same time, the first and second input signals $A_1$, $B_2$ are applied to respective inverter gates 456, 458, which generate respective inverted signals $-A_1$, $-B_1$. The logic levels of the inverted signals $-A_1$, $-B_1$ are the opposite of those of the respective input signals $A_1$, $B_1$. In operation, when the clock-less delay comparator 82A is enabled, a sign signal is generated within the sign-out circuit 420A, on line 108. As illustrated in FIG. 8, the sign-out circuit 420A is merged with the comparator circuit 83A. Similar to the operation of the delay comparator 82 illustrated in FIG. 7, the sign signal in the FIG. 8 configuration is forwarded to the digital block 110 on line 108, and represents the order in which the output signals $A_1$, $B_1$ arrive at the first and threshold inputs 92, 94 of the clock-less delay comparator 82A.

The inverted signals $-A_1$, $-B_1$ are applied to the third and fourth transistors 430, 432 of the sign out circuit 420A, and to two extra transistors 460, 462. In the illustrated configuration, the first inverted signal $-A_1$ is applied to the fourth and first-extra transistors 432, 460 of the sign-out circuit 420A, and the third and first-extra transistors 430, 460 of the sign-out circuit 420A are electrically connected to each other in series. The second inverted signal $-B_1$ is applied to the third and second-extra transistors 430, 462 of the sign-out circuit 420A, and the fourth and second-extra transistors 432, 462 of the sign-out circuit 420A are electrically connected to each other in series. Thus, the operation of the sign-out circuit 420A is controlled by both of the inverted signals $-A_1$, $-B_1$.

As illustrated in FIG. 8, the first and second conductive lines 416, 418 of the comparator circuit 83A are also electrically connected to a delay-out circuit 450A, via the third and fourth conductive lines 422, 444. The delay-out circuit 450A is merged within the clock-less delay comparator 82A. The delay-out circuit 450A has an extra transistor 464. In operation, when the clock-less delay comparator 82A is enabled, a delay signal $B_2$ is generated on line 90. The timing of the leading edge of the delay signal $B_2$ on outgoing line 90 relative to the timing of the earlier-arriving of the leading edges of the signals $A_1$, $B_2$ on inputs 92, 94 is the comparator delay 102 (FIG. 2). The timing of the delay-out circuit 450A is controlled by both of the inverted signals $-A_1$, $-B_1$, which are applied to the third transistor 446 and the extra transistor 464. In the FIG. 8 configuration, the third and extra transistors 446, 464 of the delay-out circuit 450A are connected to each other in series between the drains of the first and second transistors 442, 444 of the delay-out circuit 450A and ground.

Figure 9:
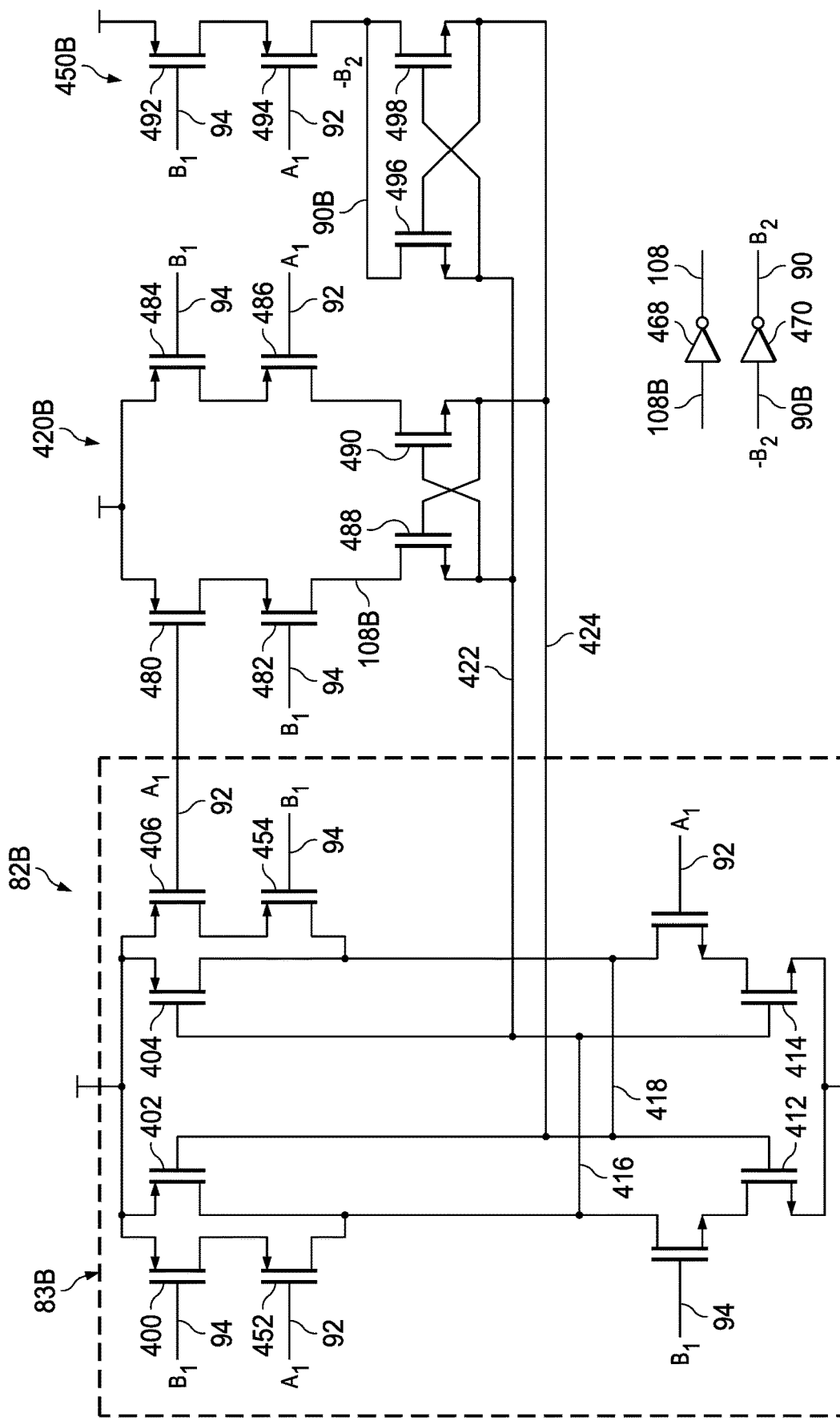
FIG. 9 is a circuit diagram of another example of a clock-less comparator circuit merged with sign-out and delay-out circuits.

Whereas the merged clock-less comparator 82A illustrated in FIG. 8 has a P barrier configuration, a second merged clock-less comparator 82B illustrated in FIG. 9 has an N barrier configuration. The second clock-less delay comparator 82B is similar to the clock-less delay comparator 82A illustrated in FIG. 8 except that (1) the non-inverted input signals $A_1$, $B_1$ are used to control the operation of inverted sign-out and inverted delay-out circuits 420B, 450B in the second clock-less delay comparator 82B, and (2) inverter gates 468, 470 are used in the FIG. 9 configuration to generate the non-inverted sign signal on digital line 108 and the non-inverted delay signal $B_2$ on output line 90. The second clock-less delay comparator 82B may be used in any one of the first and subsequent stages 70, 72, 74 illustrated in FIG. 1 in place of the first and subsequent delay comparators 82, 84, 86.

As illustrated in FIG. 9, the inverted sign-out circuit 420B, which is merged with the comparator circuit 83B, has first, second, third, fourth, fifth, and sixth transistors 480, 484, 482, 486, 488, 490. The sources of the fifth and sixth transistors 488, 490 are electrically connected to the third and fourth conductive lines 422, 424, respectively. The gates of the fifth and sixth transistors 488, 490 are electrically connected to the fourth and third conductive lines 424, 422, respectively. In operation, an inverted sign signal is generated within the inverted sign-out circuit 420B, on line 108B.

The inverted sign signal on line 108B is inverted by one of the inverter gates 468 to generate the non-inverted sign-out signal on line 108, which is applied to the digital block 110 (not illustrated in FIG. 9). The non-inverted sign-out signal represents the order in which the input signals $A_1$, $B_1$ arrive at the first and threshold inputs 92, 94 of the second clock-less delay comparator 82B. The operation of the inverted sign-out circuit 420B is controlled by the first and second input signals $A_1$, $B_1$, which are applied to the first and fourth transistors 480, 486, and to the second and third transistors 484, 482, respectively, on the first and threshold inputs 92, 94, respectively.

The first and second conductive lines 416, 418 are electrically connected to the inverted delay-out circuit 450B via the third and fourth conductive lines 422, 444, respectively. The inverted delay-out circuit 450B has first, second, third, and fourth transistors 492, 494, 496, 498. In operation, when the second clock-less delay comparator 82B is enabled, an inverted delay signal $-B_2$ is generated on line 90B. The inverted delay signal $-B_2$ is inverted by the second inverter 470 to generate the non-inverted delay signal $B_2$. The timing of the leading edge of the non-inverted delay signal $B_2$ on outgoing line 90 relative to the timing of the earlier-arriving of the leading edges of the signals $A_1$, $B_1$ on the comparator inputs 92, 94 is the comparator delay 102 (FIG. 2).

As illustrated in FIG. 9, the sources of the third and fourth transistors 496, 498 of the inverted delay-out circuit 450B are electrically connected to the third and fourth conductive lines 422, 424, respectively. The gates of the third and fourth transistors 496, 498 of the inverted delay-out circuit 450B are electrically connected to the fourth and third conductive lines 424, 422, respectively. The operation of the inverted delay-out circuit 450B is controlled by both of the input signals $A_1$, $B_1$, which are applied to the gates of the second and first transistors 494, 492 of the inverted delay-out circuit 450B. As illustrated in FIG. 9, the first and second transistors 492, 494 of the inverted delay-out circuit 450B are electrically connected to each other in series.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A clock-less delay comparator coupled to a first input signal and a second input signal, the clock-less delay comparator comprising:
   a first transistor having a control terminal coupled to the second input signal, a first current terminal coupled to a first voltage supply, and a second current terminal;
   a second transistor having a control terminal, a first current terminal coupled to the first voltage supply, and a second current terminal;

a third transistor having a control terminal, a first current terminal coupled to the first voltage supply, and a second current terminal;

a fourth transistor having a control terminal coupled to the first input signal, a first current terminal coupled to the first voltage supply, and a second current terminal;

a fifth transistor having a control terminal coupled to the second input signal, a first current terminal, and a second current terminal coupled to the control terminal of the third transistor;

a sixth transistor having a control terminal coupled to the first input signal, a first current terminal, and a second current terminal coupled to the control terminal of the second transistor and the second current terminal of the third transistor;

a seventh transistor having a control terminal coupled to the control terminal of the second transistor, a first current terminal coupled to a second voltage supply, and a second current terminal coupled to the first current terminal of the fifth transistor;

an eighth transistor having a control terminal coupled to the control terminal of the third transistor, a first current terminal coupled to the second voltage supply, and a second current terminal coupled to the first current terminal of the sixth transistor;

a ninth transistor having a control terminal coupled to the first input signal, a first current terminal coupled to the second current terminal of the first transistor, and a second current terminal coupled to the second current terminal of the second transistor and the second current terminal of the fifth transistor; and a tenth transistor having a control terminal coupled to the second input signal, a first current terminal coupled to the second terminal of the fourth transistor, and a second current terminal coupled to the second current terminal of the third transistor.

2. The clock-less delay comparator of claim 1, wherein a first output is coupled to the control terminals of the second and seventh transistors, and a second output is coupled to the control terminals of the third and eighth transistors.

3. The clock-less delay comparator of claim 2, wherein the first and second outputs are coupled to sign-out circuit.

4. The clock-less delay comparator of claim 2, wherein the first and second outputs are coupled to a delay-out circuit.

5. The clock-less delay comparator of claim 1, wherein the first input signal has a rising edge at a first time and the second input signal has a rising edge at a second time.

6. The clock-less delay comparator of claim 5, wherein an order of occurrence of the first time and the second time and an amount of time between the first time and the second time are representative of an input voltage.

7. The clock-less delay comparator of claim 1, wherein the clock-less delay comparator is implemented in an analog-to-digital converter.

8. The clock-less delay comparator of claim 1, wherein the first, second, third, fourth, ninth and tenth transistors are p-type metal-oxide-semiconductor field-effect transistors (pMOSFET).

9. The clock-less delay comparator of claim 1, wherein the fifth, sixth, seventh and eighth transistors are n-type metal-oxide-semiconductor field-effect transistors (nMOSFET).

10. A delay comparator coupled to a first input signal, a second input signal and a clock, the delay comparator comprising:

a first transistor having a control terminal coupled to the clock, a first current terminal coupled to a first voltage supply, and a second current terminal;

a second transistor having a control terminal, a first current terminal coupled to the first voltage supply, and a second current terminal coupled to the second terminal of the first transistor;

a third transistor having a control terminal, a first current terminal coupled to the first voltage supply, and a second current terminal;

a fourth transistor having a control terminal coupled to the clock, a first current terminal coupled to the first voltage supply, and a second current terminal coupled to the second current terminal of the third transistor;

a fifth transistor having a control terminal coupled to the second input signal, a first current terminal, and a second current terminal coupled to the control terminal of the third transistor and the second current terminal of the first transistor;

a sixth transistor having a control terminal coupled to the first input signal, a first current terminal, and a second current terminal coupled to the control terminal of the second transistor and the second current terminal of the third transistor;

a seventh transistor having a control terminal coupled to the control terminal of the second transistor, a first current terminal coupled to a second voltage supply, and a second current terminal coupled to the first current terminal of the fifth transistor; and an eighth transistor having a control terminal coupled to the control terminal of the third transistor, a first current terminal coupled to the second voltage supply, and a second current terminal coupled to the first current terminal of the sixth transistor.

11. The delay comparator of claim 10, wherein a first output is coupled to the control terminals of the second and seventh transistors, and a second output is coupled to the control terminals of the third and eighth transistors.

12. The delay comparator of claim 10, wherein the first input signal has a rising edge at a first time and the second input signal has a rising edge at a second time.

13. The delay comparator of claim 12, wherein an order of occurrence of the first time and the second time and an amount of time between the first time and the second time are representative of an input voltage.

14. The delay comparator of claim 10, wherein the delay comparator is implemented in an analog-to-digital converter.

15. The delay comparator of claim 10, wherein the first, second, third and fourth transistors are p-type metal-oxide-semiconductor field-effect transistors (pMOSFET).

16. The delay comparator of claim 10, wherein the fifth, sixth, seventh and eighth transistors are n-type metal-oxide-semiconductor field-effect transistors (nMOSFET).

17. The delay comparator of claim 10, wherein the first and second outputs are coupled to sign-out circuit.

18. The delay comparator of claim 10, wherein the first and second outputs are coupled to a delay-out circuit.

* * * * *